United States Patent
Kang et al.

(10) Patent No.: US 10,038,056 B2
(45) Date of Patent: Jul. 31, 2018

(54) METHOD FOR FABRICATING OF CELL PITCH REDUCED SEMICONDUCTOR DEVICE AND SEMICONDUCTOR DEVICE

(71) Applicant: MagnaChip Semiconductor, Ltd., Cheongju-si (KR)

(72) Inventors: Soo Chang Kang, Seoul (KR); Seung Hyun Kim, Seoul (KR); Dae Won Hwang, Seoul (KR); Yong Won Lee, Bucheon-si (KR)

(73) Assignee: MagnaChip Semiconductor, Ltd. (KR)

( * ) Notice: Subject to any disclaimer, the term of this patent is extended or adjusted under 35 U.S.C. 154(b) by 0 days.

(21) Appl. No.: 15/376,156

(22) Filed: Dec. 12, 2016

(65) Prior Publication Data

US 2017/0194433 A1    Jul. 6, 2017

(30) Foreign Application Priority Data

Dec. 31, 2015 (KR) .................. 10-2015-0191202

(51) Int. Cl.

| | |
|---|---|
| *H01L 21/336* | (2006.01) |
| *H01L 21/331* | (2006.01) |
| *H01L 27/148* | (2006.01) |
| *H01L 29/76* | (2006.01) |
| *H01L 29/06* | (2006.01) |
| *H01L 21/265* | (2006.01) |
| *H01L 29/10* | (2006.01) |
| *H01L 29/40* | (2006.01) |

(Continued)

(52) U.S. Cl.
CPC .... *H01L 29/0696* (2013.01); *H01L 21/26513* (2013.01); *H01L 29/1095* (2013.01); *H01L 29/402* (2013.01); *H01L 29/408* (2013.01); *H01L 29/66734* (2013.01); *H01L 29/7811* (2013.01); *H01L 29/7813* (2013.01)

(58) Field of Classification Search
CPC ............ H01L 29/407; H01L 29/42356; H01L 29/66348; H01L 29/66628; H01L 29/7397; H01L 29/7813; H01L 27/0886; H01L 27/0924; H01L 27/10841; H01L 21/76877; H01L 21/76879
USPC ........ 438/259, 270, 361; 257/135, 220, 263, 257/302, 330, 331
See application file for complete search history.

(56) References Cited

U.S. PATENT DOCUMENTS

| | | |
|---|---|---|
| 5,298,780 A | 3/1994 | Harada |
| 6,509,607 B1 * | 1/2003 | Jerred ................. H01L 29/7813 257/329 |

(Continued)

*Primary Examiner* — Hsien Ming Lee
(74) *Attorney, Agent, or Firm* — McGuire Woods LLP

(57) ABSTRACT

A method for fabricating a semiconductor device is disclosed. A plurality of trenches is formed at a predetermined cell pitch in an upper surface portion of a substrate. A first insulation film is formed on the substrate. A gate electrode is formed and partially filled within each trench. A first conductivity type region is formed in the upper surface portion of the substrate between the trenches. A second conductivity type region is formed in a side surface of the substrate between the trenches and the first conductivity type region. A second insulation film is formed covering the gate electrode within each trench, wherein an upper surface of the second insulation film is positioned lower than an upper surface of the substrate. A source metal layer is formed on the second insulation film and electrically connected to the first conductivity type region and the second conductivity type region.

21 Claims, 9 Drawing Sheets

(51) Int. Cl.
    *H01L 29/66*        (2006.01)
    *H01L 29/78*        (2006.01)

(56) References Cited

U.S. PATENT DOCUMENTS

| | | | |
|---|---|---|---|
| 8,618,601 B2* | 12/2013 | Chen | H01L 29/7827 |
| | | | 257/330 |
| 9,070,585 B2* | 6/2015 | Hossain | H01L 29/407 |
| 2014/0084363 A1* | 3/2014 | Pearse | H01L 29/407 |
| | | | 257/330 |

\* cited by examiner

METHOD FOR FABRICATING OF CELL PITCH REDUCED SEMICONDUCTOR DEVICE AND SEMICONDUCTOR DEVICE

CROSS REFERENCE TO PRIOR APPLICATIONS

This application claims the benefit under 35 U.S.C. § 119(a) of Korean Patent Application No. 10-2015-0191202 filed on Dec. 31, 2015 in the Korean Intellectual Property Office, the entirety of which is hereby incorporated herein by reference.

FIELD OF THE DISCLOSURE

The present disclosure relates generally to a semiconductor device, and more specifically it relates to a low on-state resistance ($R_{ON}$) semiconductor device and a method of manufacturing the same.

BACKGROUND OF THE DISCLOSURE

There have been various attempts to produce a low on-state resistance ($R_{ON}$) semiconductor device. In the case of a trench metal oxide semiconductor field effect transistors (MOSFETs), the on-state resistance ($R_{ON}$) may be lowered by reducing an interval between two adjoining trenches, which is known as cell pitch. An example of a trench MOSFET is shown in FIG. 1. A trench MOSFET having a reduced cell pitch may be constructed by, for example, vertically forming an N source type and a P type body region in the same mesa, which can eliminate need for a separate contact region and hence allow for reduction in cell pitch. This approach, however, may not render the trench structure operable as a normal MOSFET. More specifically, a source region formed in a mesa needs to be sufficiently large to carry out normal MOSFET operations. If the cell pitch is reduced too much, there may not be sufficient space to form an adequately sized source region. Therefore, there is a limit to reducing cell pitch, and the fully reduced cell pitch without rendering other components inoperable may not be sufficient for substantially lowering the on-state resistance ($R_{ON}$).

Accordingly, there is a need for an optimized semiconductor device structure for lowering an on-state resistance ($R_{ON}$), and a manufacturing method thereof.

SUMMARY OF THE DISCLOSURE

One aspect of the present disclosure provides a method for fabricating a semiconductor device, which includes forming a plurality of trenches at a predetermined cell pitch in an upper surface portion of a substrate. A first insulation film is formed on the substrate. A gate electrode is formed within each trench, wherein the gate electrode partially fills each trench. A first conductivity type region is formed in the upper surface portion of the substrate between the trenches. A second conductivity type region is formed in a side surface (or side wall) of the substrate between the trenches and the first conductivity type region. A second insulation film is formed covering the gate electrode within each trench, wherein an upper surface of the second insulation film is positioned lower than an upper surface of the substrate. A source metal layer is formed on the second insulation film. The source metal layer is electrically connected to the first conductivity type region and the second conductivity type region.

The substrate may include an active region and a termination region, and the plurality of trenches may be formed in the active region. At least one of the first conductivity type region and the second conductivity type region may be formed by ion implanting without using a mask for blocking the active region.

The method may further include forming a device isolation film on the substrate in the termination region before forming the first insulation film. The gate electrode may be formed on the device isolation film. A gate metal layer may be formed, and electrically connected to the gate electrode in the termination region.

The method may further include etching back to remove an upper portion of the first conductivity type region.

The forming the second conductivity region may include ion implanting after forming a mask that partially covers the first conductivity region.

The forming the second insulation film may include etching back to remove an upper portion of the second insulation film.

The method further may include annealing after forming the second insulation film.

The predetermined cell pitch may be between about 0.4 µm and about 0.6 µm.

A length ratio between the gate electrode and the trench may be less than about 0.5.

According to another aspect of the disclosure, a semiconductor device includes a substrate including a termination region and an active region; a plurality of trenches formed in an upper surface portion of the substrate at a predetermined cell pitch in the active region; a gate electrode partially filling each trench; a first insulation film formed between the substrate and the gate electrode within each trench; a second insulation film formed on the gate electrode within each trench, wherein an upper surface of the second insulation film is positioned lower than an upper surface of the substrate; a first conductivity type region formed in the upper surface portion of the substrate between the trenches; a second conductivity type region formed in a side surface of the substrate between the trenches and the first conductivity type region; and a source metal layer formed on the second insulation film and electrically connected to the first conductivity type region and the second conductivity type region.

The semiconductor device may further include a gate metal layer electrically connected to the gate electrode in the termination region.

The first insulation film may be formed between the gate electrode and the substrate in the termination region.

The semiconductor device may include a device isolation film formed between the gate electrode and the substrate in the termination region. The device isolation film may include a LOCOS oxide film.

The second insulation film may completely fill one of the plurality of trenches located closest to the termination region and extend to cover the gate electrode in the termination region.

The predetermined cell pitch may be between about 0.4 µm and about 0.6 µm.

A length ratio between the gate electrode and the trench may be less than about 0.5

According to yet another aspect of the disclosure, a method for fabricating a semiconductor device includes forming a plurality of trenches at a predetermined cell pitch in an upper surface portion of a substrate. A first insulation film is formed on the substrate. A plurality of gate electrodes are formed within the plurality of trenches, respectively. A plurality of first conductivity type regions are formed in the upper surface portion of the substrate. Each first conductivity type region is formed between the trenches. A plurality of second conductivity type regions is formed. Each second conductivity type region is formed in a side surface of the substrate between the trench and the first conductivity type region.

The predetermined cell pitch may be between about 0.4 μm and about 0.6 μm.

According to the present disclosure, a semiconductor device may be manufactured that has minimal cell pitch between active cells, and that may have minimal semiconductor resistance.

Additional features, advantages, and embodiments of the disclosure may be set forth or apparent from consideration of the following detailed description, drawings, and claims. Moreover, it is to be understood that both the foregoing summary of the disclosure and the following detailed description are exemplary and intended to provide further explanation without limiting the scope of the disclosure as claimed.

BRIEF DESCRIPTION OF THE DRAWINGS

The accompanying drawings, which are included to provide a further understanding of the disclosure, are incorporated in and constitute a part of this specification, illustrate embodiments of the disclosure and together with the detailed description serve to explain the principles of the disclosure. No attempt is made to show structural details of the disclosure in more detail than may be necessary for a fundamental understanding of the disclosure and the various ways in which it may be practiced. In the drawings.

DETAILED DESCRIPTION OF THE DISCLOSURE

Figure 1:
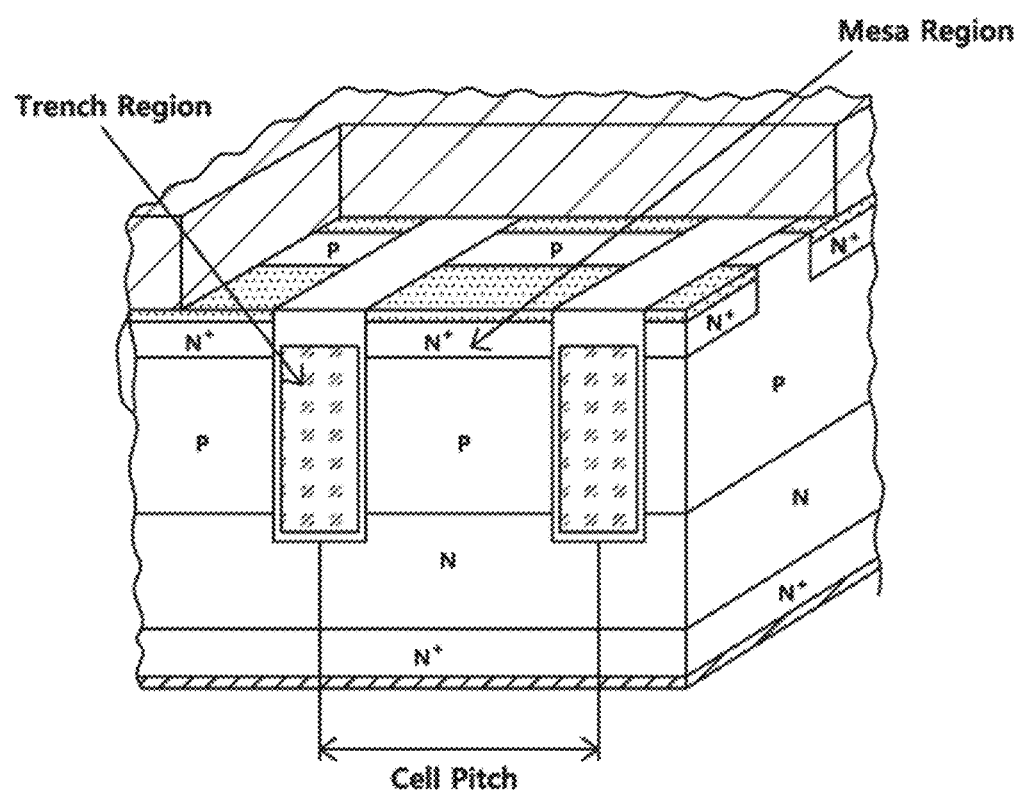
FIG. 1 illustrate an example of a trench MOSFET structure.

The disclosure and the various features and advantageous details thereof are explained more fully with reference to the non-limiting embodiments and examples that are described and/or illustrated in the accompanying drawings and detailed in the following description. It should be noted that the features illustrated in the drawings are not necessarily drawn to scale, and features of one embodiment may be employed with other embodiments as the skilled artisan would recognize, even if not explicitly stated herein. Descriptions of well-known components and processing techniques may be omitted so as to not unnecessarily obscure the embodiments of the disclosure. The examples used herein are intended merely to facilitate an understanding of ways in which the disclosure may be practiced and to further enable those of skill in the art to practice the embodiments of the disclosure. Accordingly, the examples and embodiments herein should not be construed as limiting the scope of the disclosure. Moreover, it is noted that like reference numerals represent similar parts throughout the several views of the drawings.

The disclosure is directed to a semiconductor device structure with a reduced cell pitch to lower an on-state resistance ($R_{ON}$), and a manufacturing method thereof. In particular, the disclosure provides a semiconductor device structure having an adequately sized N+ source region even when a cell pitch is reduced.

FIGS. 2A, 2B, 2C, 2D, 2E, 2F, 2G and 2H illustrate an example of a method of manufacturing a semiconductor device in various stages, according to the principles of the disclosure.

Figure 2A:
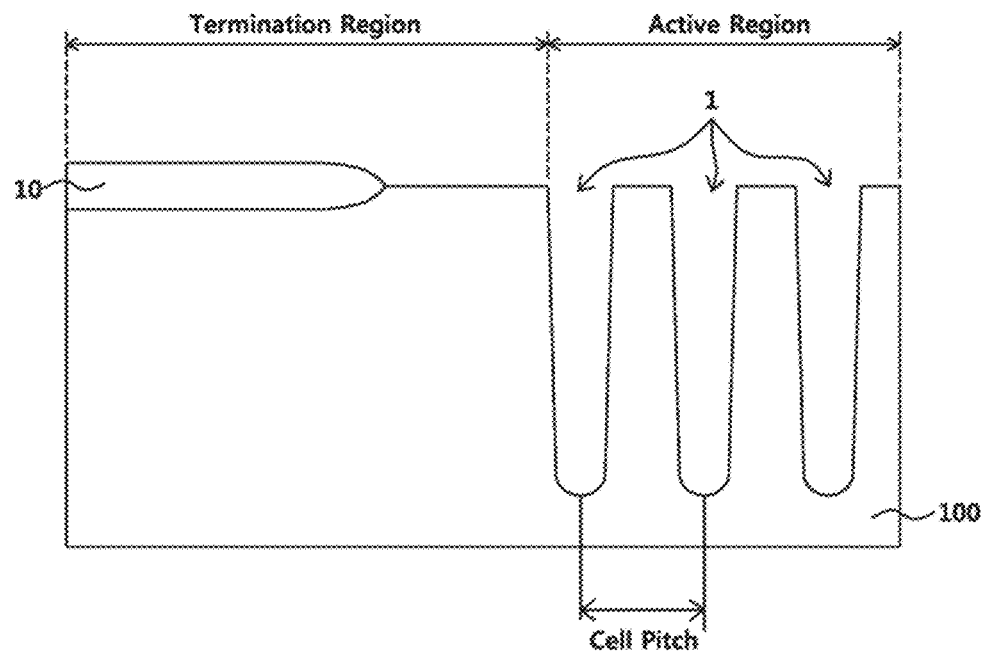
FIGS. 2A, 2B, 2C, 2D, 2E, 2F, 2G and 2H illustrate various stages of an example of a method for fabricating a semiconductor device according to the principles of the disclosure.

Referring to FIG. 2A, a substrate 100 may be provided, which may be divided into an active region and a termination region. The termination region of the completed semiconductor device may include circuitry (not shown) for providing power to the components in the active region. The substrate 100 may include silicon, and may be doped with P type or N type impurity. A plurality of trenches 1 may be formed on or in an upper surface portion of the substrate 100 with a predetermined cell pitch therebetween. The trenches 1 may be formed in the active region where a trench transistor is to be formed. The plurality of trenches 1 may be formed at a cell pitch of, for example, between about 0.4 μm and about 0.6 μm, preferably about 0.5 μm, which is substantially smaller compared to state-of-the art substrates (e.g., shown in FIG. 1). A depth of the trenches 1 may be, for example, between about 1.3 μm and about 1.5 μm.

A device isolation film 10 may be formed at the termination region. The device isolation film 10 may be formed to electrically isolate a gate electrode 30 (shown in FIG. 2B) and the silicon substrate 100 in the termination region. The device isolation film 10 may include, for example, a Local Oxidation of Silicon (LOCOS) oxide film and/or the like. The device isolation film 10 may be formed simultaneously with a first insulation film 20 (shown in FIG. 2B), or may be substituted for the first insulation film 20.

Figure 2B:
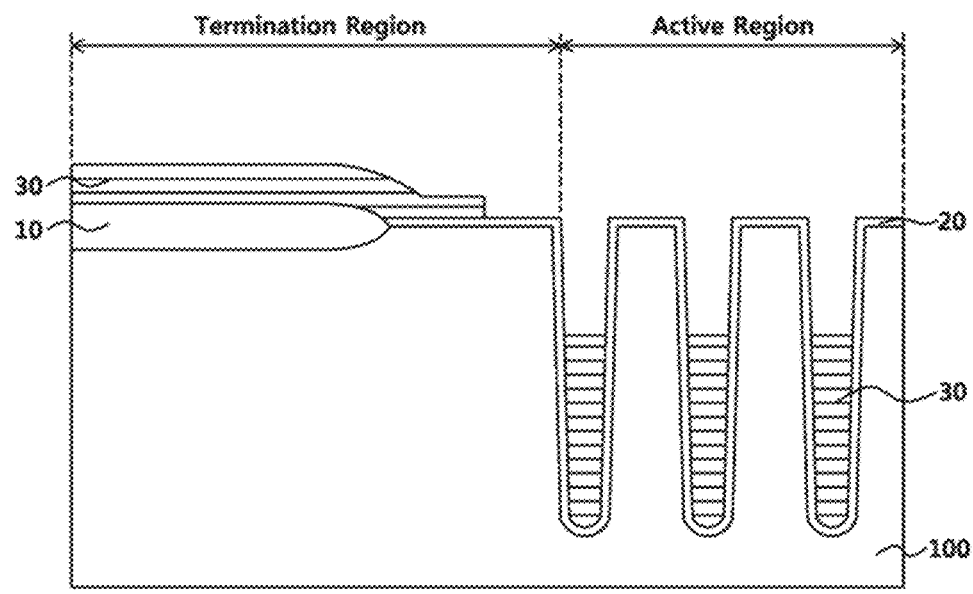

Referring to FIG. 2B, the first insulation film 20 may be formed on the substrate 100. The first insulation film 20 may be formed to entirely or partially cover a surface (e.g., the upper surface) of the substrate 100. The first insulation film 20 may cover the internal surfaces (e.g., inside) of the trenches 1 in the active region and the upper surface of substrate 100 in the termination region. The gate electrode 30 may then be formed on the substrate 100. In the active region, the gate electrode 30 may be formed on the first insulation film 20 within the trenches 1. The gate electrode 30 may be formed to be shorter than the trenches 1, via, for example, deposition, etching, and/or the like. A length ratio between the gate electrode 30 and the trenches 1 may be less than about 0.5 although a different ratio may be applied. The length ratio may be the length of the gate electrode 30 relative to the depth of the trenches 1. In the termination region, the gate electrode 30 may be formed on the device isolation film 10 and the first insulation film 20. The gate electrodes 30 in the termination region and the active region may be formed simultaneously or independently from each other.

Figure 2C:
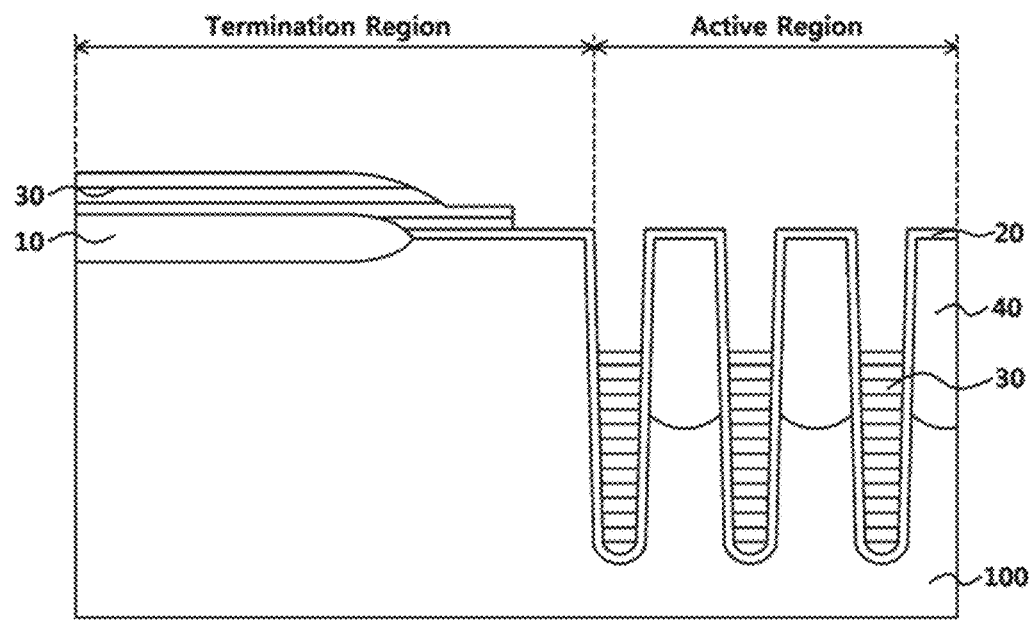
Figure 2D:
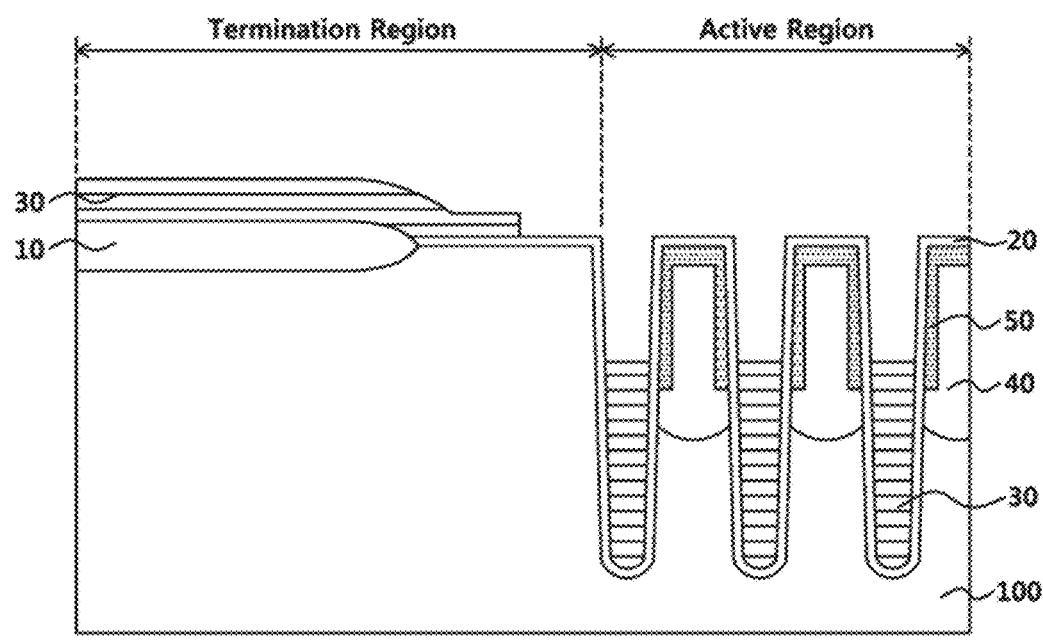

Referring to FIG. 2C, a P type body region 40 may be formed in the upper surface portions of the substrate 100 between the trenches 1, via, for example, ion implanting a P type impurity, or the like, after masking the termination region. Subsequently, as seen in FIG. 2D, an N type impurity region 50 may be formed in the active region, via, for example, ion implantation, or the like. When the P type body region 40 is formed using a mask that blocks the termination region, the same mask may be used when the N type impurity region 50 is formed via, for example, ion implanting, or the like.

As seen in FIG. 2D, the N type impurity region 50 may be formed in or on the upper surface of the substrate 100, such as, for example, between the trenches 1 and in the side surface (or side wall) of the substrate 100 between the trenches 1 and the P type body region 40 therebetween. The N type impurity region 50 may be formed to have an inverted U shape by, for example, adjusting ion implantation parameters, such as, for example, ion concentration, implantation energy, etc.

Figure 2E:
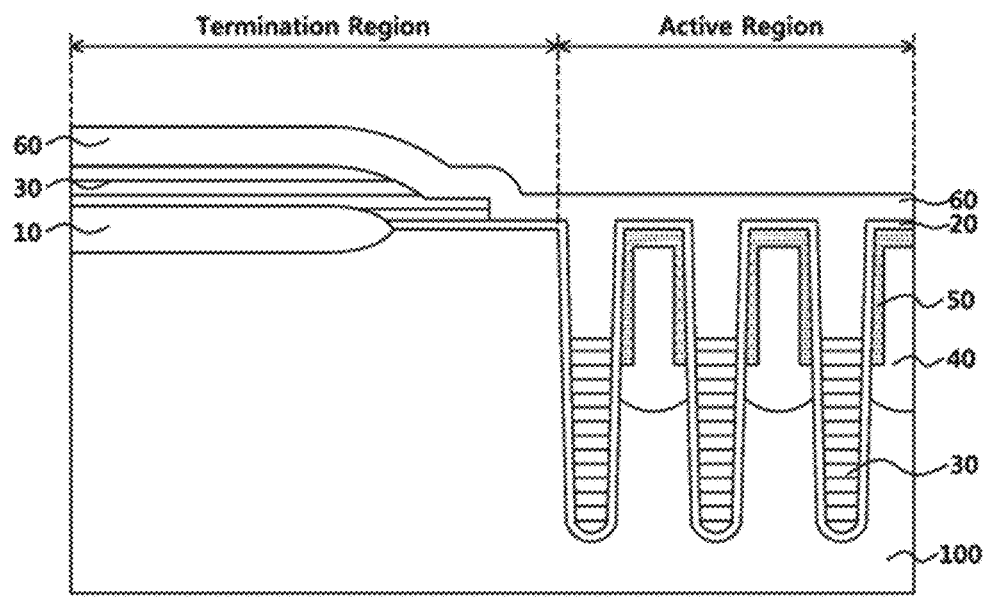

Referring to FIG. 2E, a second insulation film 60 may be formed on the surface of the substrate 100. The second insulation film 60 may be formed to cover the entire surface of the substrate 100. Annealing, or the like, may be performed to minimize stepped portions of the second insulation film 60, as seen in FIG. 2E.

Figure 2F:
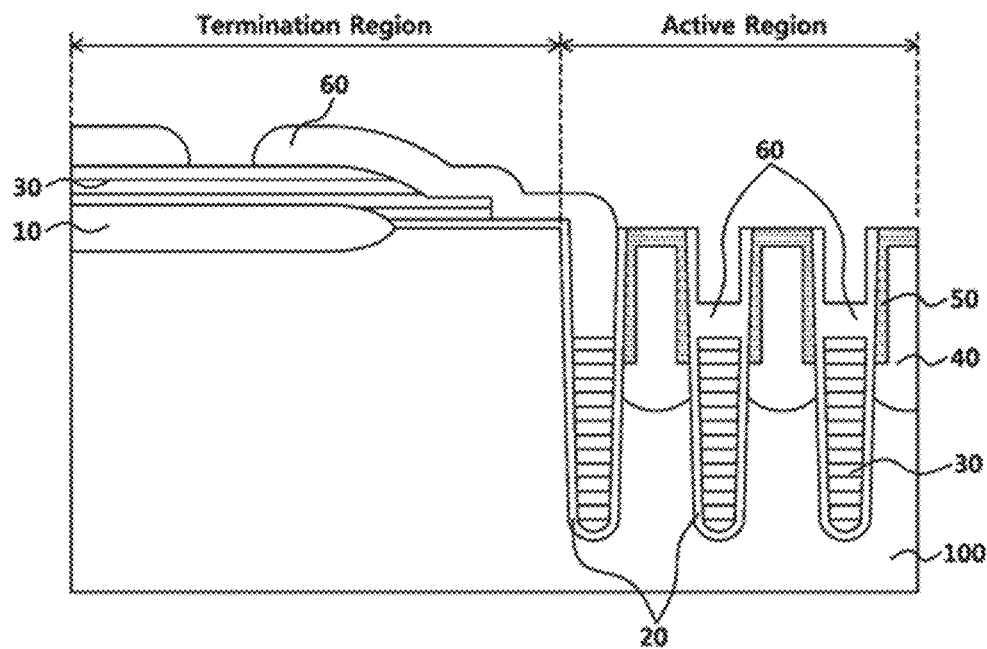

Referring to FIG. 2F, the second insulation film 60 may be patterned via, for example, etching or the like, to form contact regions (e.g., openings) in the active region and the termination region. The second insulation film 60 may be formed using a single masking step for both the active and termination regions, or, alternatively, using two separate masking steps for the active and termination regions, respectively. As seen in FIG. 2F, in the active region, the second insulation film 60 may be formed such that the gate electrode 30 is covered by the second insulation film 60 within the trenches 1, and an upper surface of the second insulation film 60 is lower than the upper surface of the substrate 100. In other words, within the trenches 1, the second insulation film 60 may be formed at a constant thickness to cover the gate electrode 30, but may not completely fill the trenches 1. The second insulation film 60 may be patterned via, for example, etching back, or the like.

Figure 2G:
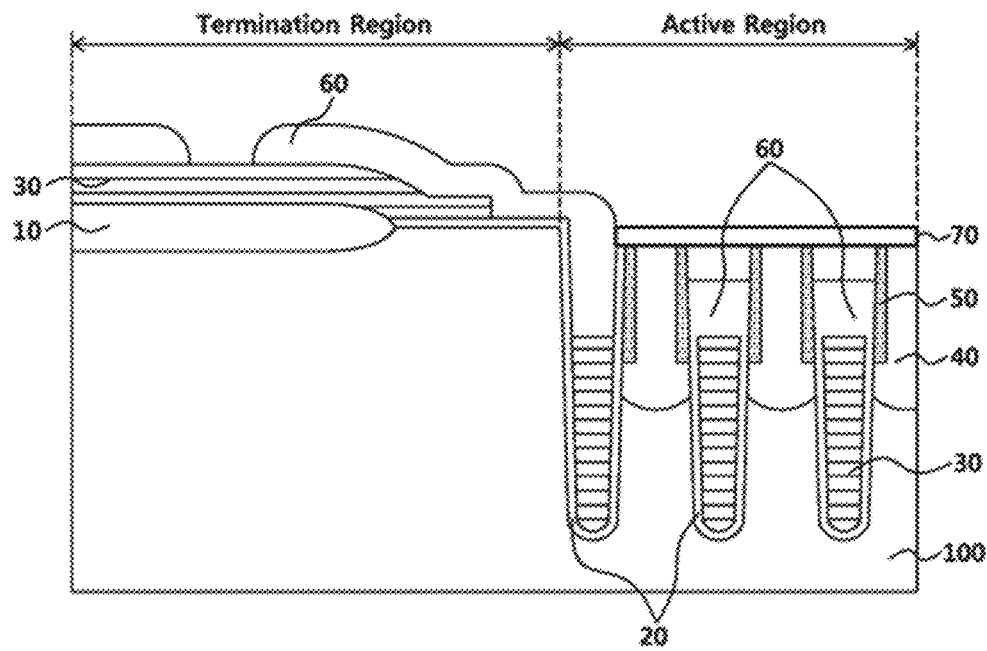
Figure 2H:
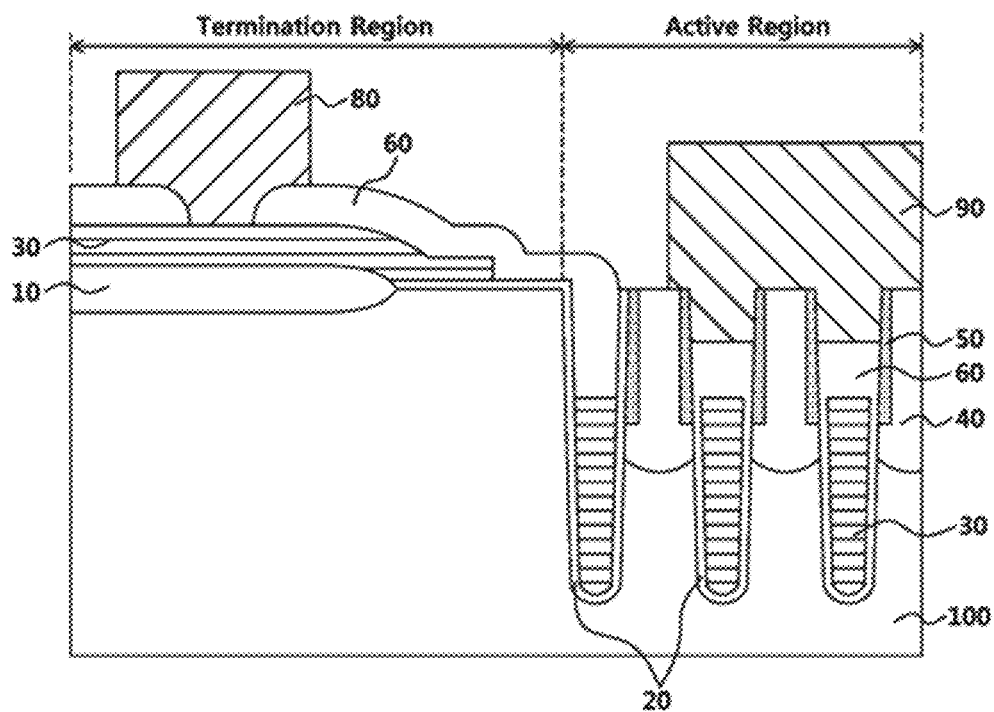

Referring to FIG. 2H, a gate metal layer 80 may be formed on the substrate 100. In the termination region, the second insulation film 60 may be formed between the gate electrode 30 and the gate metal layer 80 (shown in FIG. 2H). In FIG. 2F, the trench 1 adjacent to the termination region may not be able to operate as the trench transistor. Hence, unlike other trenches 1, the trench 1 adjacent to the termination region may be completely filled by the second insulation film 60, which may extend to the second insulation film 60 formed in the termination region.

Subsequently, as illustrated in FIG. 2G, an upper portion of the structures formed in the active region may be removed, via, for example, etching back or the like. In doing so, the second insulating film 60 may operate as a mask. The upper portion of the structures that is not covered by the second insulating film 60 may be selectively removed. Through this step, the portion of the N type impurity region 50 formed in the upper surface of the substrate 100 may be removed, thereby leaving the portion formed in the side surface (or side wall) of the substrate 100 between the trenches 1 and the P type body region 40. Such etching may be carried out by using, for example, etching selectivity, or the like.

Referring to FIG. 2H, the gate metal layer 80 and a source metal layer 90 may be formed. The gate metal layer 80 may be formed to be electrically connected to the gate electrode 30 in the termination region. The source metal layer 90 may be formed to be electrically connected to the N type source region 50 and the P type body region 40 of the active region. The gate metal layer 80 and the source metal layer 90 may be formed simultaneously in the same processing step, or alternatively may be formed independently through different processing steps.

As seen in FIG. 2H, the N type source regions 50 may be vertically arranged on the side surface of the substrate 100 at a regular interval with the P type body region 40 therebetween. This can allow reduction of the cell pitch to, for example, between about 0.4 µm and about 0.6 µm, and preferably less than about 0.5 µm, without rendering the N type source regions 50 inoperable or inadequate for normal operations. With the reduced cell pitches, the on-state resistance ($R_{ON}$) of the device may also be lowered. Also, a separate masking step may not be necessary to form the N type source region 50, thereby reducing the manufacturing costs.

FIGS. 3A, 3B, 3C, 3D, 3E, 3F and 3G illustrate another example of a method of manufacturing a semiconductor device in various stages, according to the principles of the disclosure. The method shown in FIGS. 3A to 3G may be similar to the method shown in FIGS. 2A to 2H, which will not be repeated below. For example, the steps illustrated in FIGS. 3A, 3B and 3C may be substantially similar to the steps illustrated in FIGS. 2A, 2B and 2C, and, therefore, the description thereof is omitted in this disclosure.

Figure 3A:
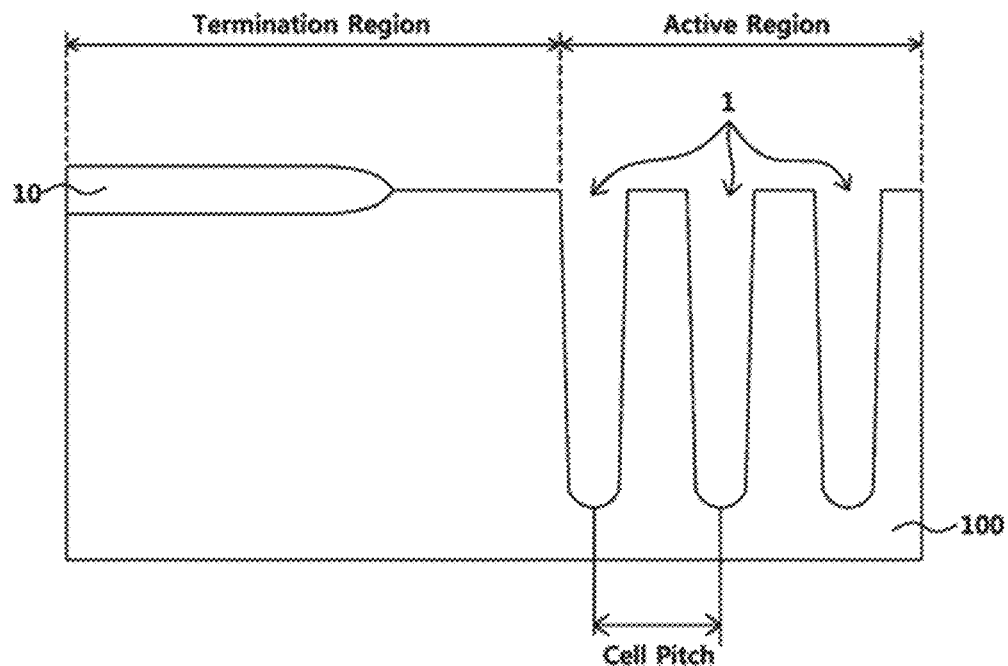
FIGS. 3A, 3B, 3C, 3D, 3E, 3F and 3G illustrate various stages of another example of a method for fabricating a semiconductor device according to the principles of the disclosure.
Figure 3B:
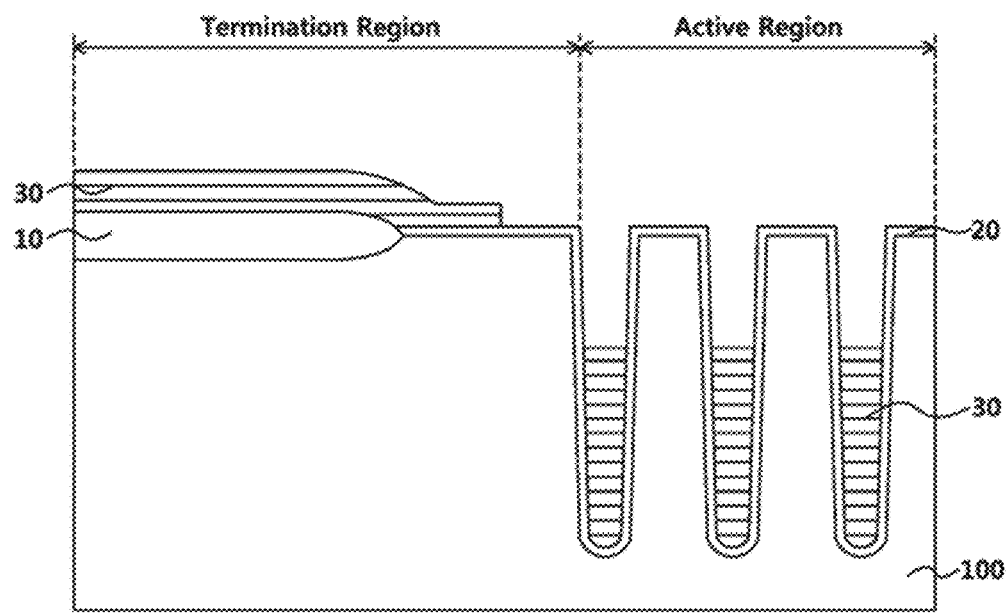
Figure 3C:
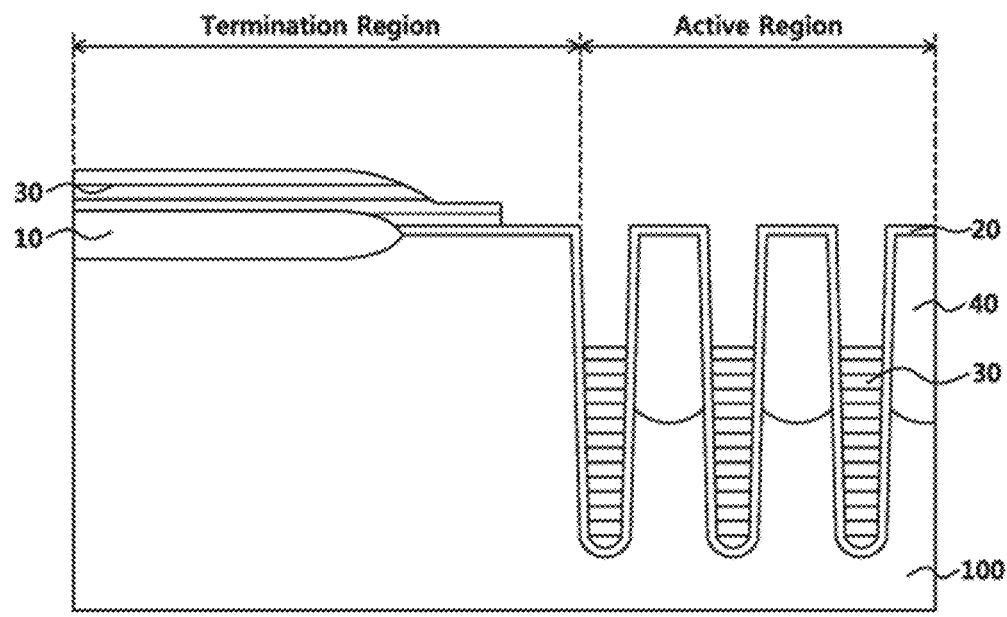
Figure 3D:
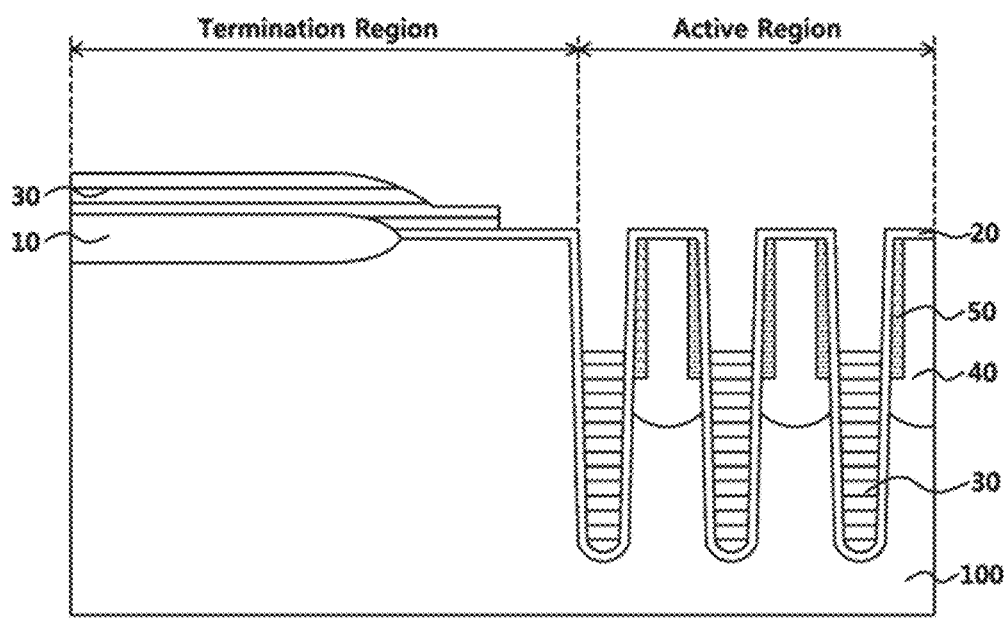

Referring to FIG. 3D, in the active region, an N type source region 50 may be formed in the side surface of the substrate 100 between the trenches 1 and the P type body region 40. Unlike the N type source region 50 shown in FIG. 2D, the N type source region 50 shown in FIG. 3D may not be formed in the upper surface of the substrate 100. The N type source region 50 may be formed via, for example, masking, ion implantation (e.g., tilt ion implantation), and the like. Since the N type source regions 40 are formed vertically on the side surface of the substrate 100 between the trenches 1 and the P type body region 40, the trenches 1 may be formed with a reduced cell pitch, which can result in lowering the on-state resistance ($R_{ON}$) of the device.

Figure 3E:
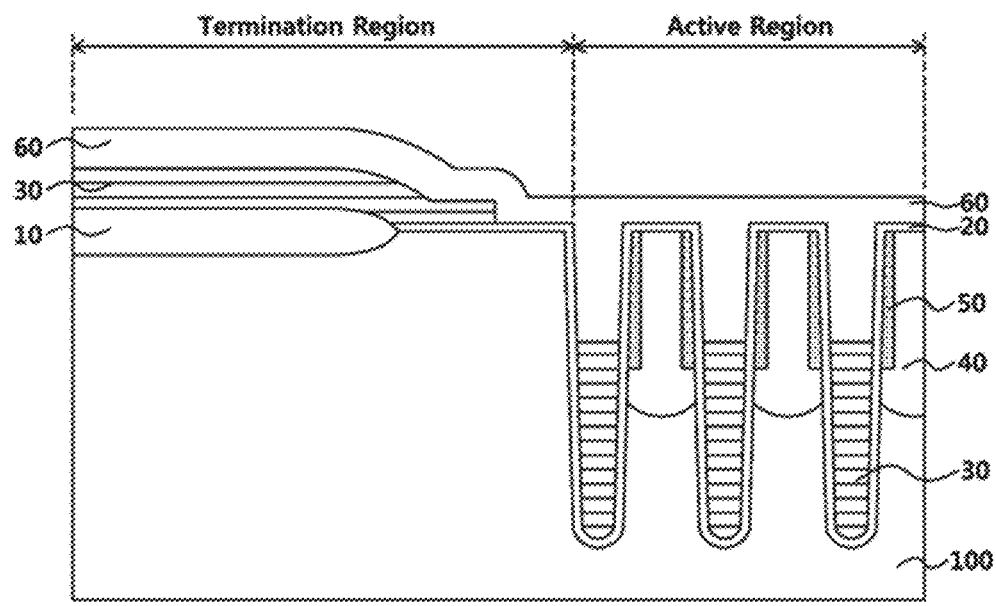

Referring to FIG. 3E, a second insulation film 60 may be formed to cover the entire upper surface of the substrate 100. Annealing, or the like, may be performed to minimize stepped portions of the second insulation film 60, which may result in the shape of the second insulation film 60 seen in FIG. 3E.

Figure 3F:
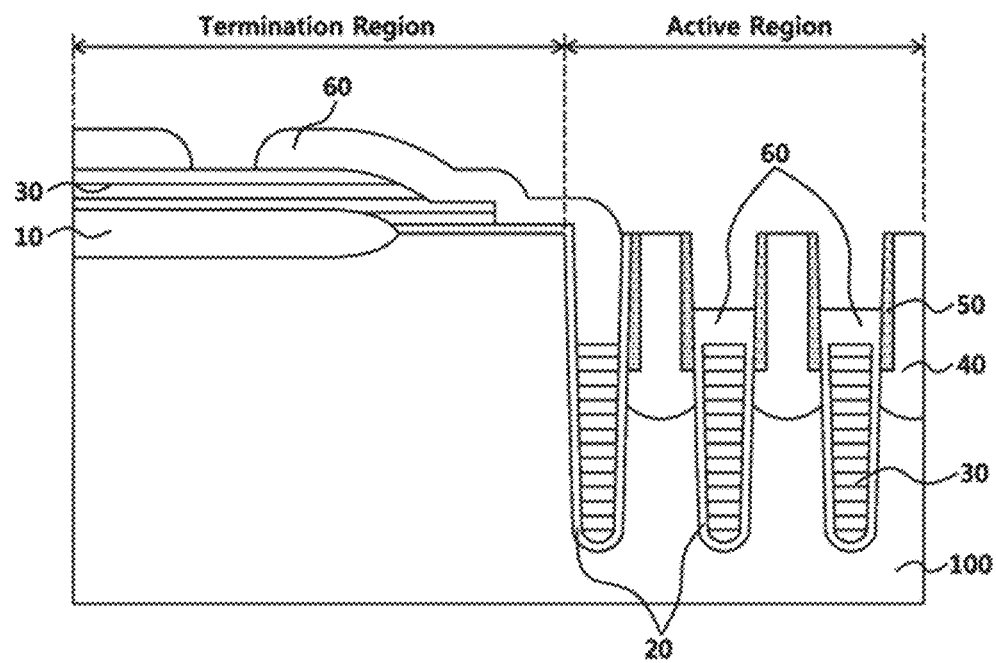

Referring to FIG. 3F, the second insulation film 60 in the active region may be patterned via, for example, masking, etching, and the like, to form contact regions (e.g., openings). A separate masking step may be carried out to pattern the second insulation film 60 in the termination region. In the active region, the second insulation film 60 is formed to cover the gate electrode 30 within the trenches 1, and the upper surface of the second insulation film 60 may be lower than the upper surface of the substrate 100. In other words, the second insulation film 60 covers the gate electrode 30 without completely filling the trenches 1. The second insulation film 60 may be shaped via, for example, etching back or the like.

In the termination region, the second insulation film 60 may be patterned to expose the gate electrode 30 such that a gate metal layer 80 (shown in FIG. 3G) may be electrically connected to the gate electrode 30. One of the trenches 1 located closest to the termination region may not be able to operate as a trench transistor. Thus, unlike other trenches 1, the trench 1 closest to the termination region may be completely filled by the second insulation film 60, which may also extend to the second insulation film 60 in the termination region.

Figure 3G:
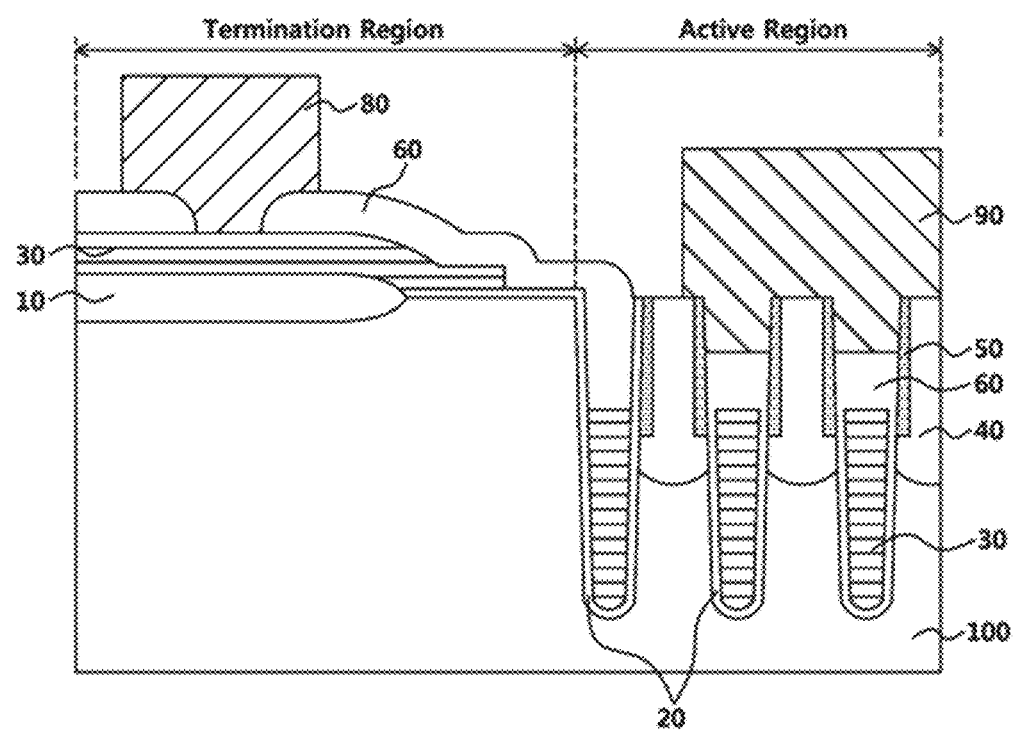

Referring to FIG. 3G, the gate metal layer 80 may be formed in the termination region, which may be electrically connected to the gate electrode 30. Also, a source metal layer 90 may be formed in the active region, which may be electrically connected to the N type source region 50 and the P type body region 40. The gate metal layer 80 and the source metal layer 90 may be formed simultaneously through the same processing step, or, alternatively, formed independently through the different processing steps.

FIGS. 2H and 3G illustrate examples of low $R_{ON}$ semiconductor devices, constructed according to the principles of the disclosure. The semiconductor device may include, in the active region, a plurality of trenches 1 (shown in FIGS. 2A and 3A) formed in the upper surface portion of the substrate 100 at a predetermined cell pitch of, for example, between about 0.4 µm and about 0.6 µm. The gate electrode 30 may be formed within each of the trenches 1. The gate electrode 30 may not completely fill the trenches 1, and an upper portion of the trenches 1 may not be occupied by the gate electrode 30. A length ratio between the gate electrode 30 and the trenches 1 may be, for example, less than about 0.5.

The first insulation film 20 may be formed between the substrate 100 and the gate electrode 30 within the trenches 1. The second insulation film 60 may be formed on the gate electrode 30 within the trenches 1. An upper surface of the second insulation film 60 may be lower than an upper surface of the substrate 100. The P type body region 40 maybe formed in the upper surface portions of the substrate 100 between the trenches 1. The N type source region 50 may be formed vertically at a regular interval in the side surfaces of the substrate between the trenches 1 and the P type body region 40. The source metal layer 90 may be formed on the second insulation layer 60 and electrically connected to the P type body region 40 and the N type source region 50.

In the termination region, the device isolation film 10 may be formed on the substrate 100 between the gate electrode 30 and the substrate 100. The second insulation layer 60 may be formed between the gate metal layer 80 and the gate electrode 30. The gate metal layer 80 may be electrically connected to the gate electrode 30.

In the semiconductor device structures shown in FIGS. 2H and 3G, the gate electrode 30 formed within the trenches 1 is shorter than the trenches 1, thereby leaving an upper surface portion of the trenches unoccupied by the gate electrode 30. The ratio between the lengths of the gate electrode 30 and the trenches 1 may be less than about 0.5 although a different ratio may be applied. Also, the cell pitch of the trenches 1 may be between about 0.4 µm and about 0.6 µm, and preferably less than about 0.5 µm, which is less than the cell pitches of state-of-the art semiconductor devices.

According to the disclosure, the N type source regions 50 are vertically formed in the side surface of the substrate between the trenches 1 and the P type body regions 40. The N type source region 50 does not occupy the entire upper surface portion of the substrate 100 between the trenches 1. Accordingly, the cell pitch can be reduced to, for example, between about 0.4 µm and about 0.6 µm, and preferably less than about 0.5 µm, without rendering other components inoperable or inadequate for normal operations. This may result in lowering the on-state resistance ($R_{ON}$) of the device.

Also, the gate electrode 30 formed within the trenches 1 may be electrically isolated from the N type source region 50 by the first insulation film 20 covering the lower portion of the gate electrode 30 and the second insulation film 60 covering the upper portion of the gate electrode 30. Accordingly, even when a gate voltage and a source voltage are applied via the gate metal layer 80 and the source metal layer 90, respectively, the gate electrode 30 formed within the trenches 1 is electrically isolated from the source region 50 and therefore the semiconductor device may operate as a normal trench MOSFET.

The terms "including," "comprising," "having" and variations thereof, as used in this disclosure, mean "including, but not limited to," unless expressly specified otherwise.

The terms "a," "an," and "the," as used in this disclosure, means "one or more", unless expressly specified otherwise.

Devices that are in communication with each other need not be in continuous communication with each other, unless expressly specified otherwise. In addition, devices that are in communication with each other may communicate directly or indirectly through one or more intermediaries.

Although process steps, method steps, or the like, may be described in a sequential order, such processes and methods may be configured to work in alternate orders. In other words, any sequence or order of steps that may be described does not necessarily indicate a requirement that the steps be performed in that order. The steps of the processes or methods described herein may be performed in any order practical. Further, some steps may be performed simultaneously.

When a single device or article is described herein, it will be readily apparent that more than one device or article may be used in place of a single device or article. Similarly, where more than one device or article is described herein, it will be readily apparent that a single device or article may be used in place of the more than one device or article. The functionality or the features of a device may be alternatively embodied by one or more other devices which are not explicitly described as having such functionality or features.

Spatially descriptive terms such as, for example, down, below, beneath, lower, up, above, upper, or the like, may be used to describe correlations between one device and elements, or between other devices and/or elements. The descriptive terms are provided for purposes of facilitating an understanding of the disclosure, without limiting the disclosure.

While the disclosure has been described in terms of exemplary embodiments, those skilled in the art will recognize that the disclosure can be practiced with modifications in the spirit and scope of the appended claim, drawings and attachment. The examples provided herein are merely illustrative and are not meant to be an exhaustive list of all possible designs, embodiments, applications or modifications of the disclosure.

What is claimed is:

1. A method for fabricating a semiconductor device, comprising:
   forming a plurality of trenches at a predetermined cell pitch in an upper surface portion of a substrate;
   forming a first insulation film on the substrate;
   forming a gate electrode within each trench, wherein the gate electrode partially fills each trench from a bottom portion thereof;
   forming a first conductivity type region in the upper surface portion of the substrate between the trenches;
   forming a second conductivity type region in the upper surface portion of the substrate between the trench and the first conductivity type region;
   forming a second insulation film that covers the gate electrode within each trench, wherein an upper surface of the second insulation film is positioned lower than an upper surface of the substrate; and forming a source metal layer on the second insulation film, the source metal layer electrically connected to the first conductivity type region and the second conductivity type region, wherein the substrate comprises an active region and a termination region, and the plurality of trenches are formed in the active region.

2. The method of claim 1, wherein at least one of the first conductivity type region and the second conductivity type region is formed by ion implanting without using a mask for blocking the active region.

3. The method of claim 1, further comprising:
forming a device isolation film on the substrate in the termination region before forming the first insulation film;
forming the gate electrode on the device isolation film; and
forming a gate metal layer that is electrically connected to the gate electrode in the termination region.

4. The method of claim 1, further comprising etching back to remove an upper portion of the second conductivity type region after the second conductivity type region is formed in the upper surface portion of the substrate, thereby disposing a portion of the second conductivity type region at an upper portion of a sidewall of the trench.

5. The method of claim 1, wherein the forming the second conductivity type region comprises ion implanting after forming a mask that partially covers the first conductivity type region.

6. The method of claim 1, wherein the for second insulation film comprises etching back to remove an upper portion of the second insulation film.

7. The method of claim 1, further comprising annealing after forming the second insulation film.

8. The method of claim 1, wherein the predetermined cell pitch is between about 0.4 µm and about 0.6 µm.

9. The method of claim 1, wherein a length ratio between the gate electrode and the trench is less than about 0.5.

10. A semiconductor device, comprising:
a substrate having a termination region and an active region;
a plurality of trenches formed in an upper surface portion of the substrate at a predetermined cell pitch in the active region;
a gate electrode partially filling each trench from a bottom portion thereof;
a first insulation film formed between the substrate and the gate electrode within each trench;
a second insulation film formed on the gate electrode within each trench, wherein an upper surface of the second insulation film is positioned lower than an upper surface of the substrate;
a first conductivity type region formed in the upper surface portion of the substrate between the trenches;
a second conductivity type region formed in the upper surface portion of the substrate between the trench and the first conductivity type region; and
a source metal layer formed on the second insulation film and electrically connected to the first conductivity type region and the second conductivity type region,
wherein the second conductivity type region is absent on a sidewall of the trench located closest to the terminal region.

11. The semiconductor device of claim 10, further comprising a gate metal layer electrically connected to the gate electrode in the termination region.

12. The semiconductor device of claim 10, wherein the first insulation film is formed between the gate electrode and the substrate in the termination region.

13. The semiconductor device of claim 10, further comprising a device isolation film formed between the gate electrode and the substrate in the termination region.

14. The semiconductor device of claim 13, wherein the device isolation film comprises a LOCOS oxide film.

15. The semiconductor device of claim 10, wherein the second insulation film completely fills one of the plurality of trenches located closest to the termination region and extends to cover the gate electrode in the termination region.

16. The semiconductor device of claim 10, wherein the predetermined cell pitch is between about 0.4 µm and about 0.6 µm.

17. The semiconductor device of claim 10, wherein a length ratio between the gate electrode and the trench is less than about 0.5.

18. A method for fabricating a semiconductor device, comprising:
forming a plurality of trenches at a predetermined cell pitch in an upper surface portion of a substrate;
forming a first insulation film on the substrate;
forming a plurality of gate electrodes within the plurality of trenches, respectively, each gate electrode partially filling the trench from a bottom portion thereof;
forming a first conductivity type region in the upper surface portion of the substrate, the first conductivity type region being formed between the trenches;
forming a second conductivity type region, the second conductivity type region being formed in the upper surface portion of the substrate between the trench and the first conductivity type region; and
etching back to remove an upper portion of the second conductivity type region after the second conductivity type region is formed in the upper surface portion of the substrate, thereby disposing a portion of the second conductivity type region at an upper portion of a sidewall of the trench.

19. The method of claim 18, wherein the predetermined cell pitch is between about 0.4 µm and about 0.6 µm.

20. The method of claim 18, wherein the substrate comprises an active region and a termination region, and the plurality of trenches are formed in the active region.

21. The method of claim 20, wherein at least one of the first conductivity type region and the second conductivity type region is formed by ion implanting without using a mask for blocking the active region.

* * * * *